United States Patent [19]

Tasch, Jr et al.

[11] 4,060,738
[45] Nov. 29, 1977

[54] CHARGE COUPLED DEVICE RANDOM ACCESS MEMORY

[75] Inventors: Al F. Tasch, Jr, Richardson; Robert Charles Frye, Plano; Horng-Sen Fu; Robert W. Brodersen, both of Dallas, all of Tex.

[73] Assignee: Texas Instruments Incorporated, Dallas, Tex.

[21] Appl. No.: 739,758

[22] Filed: Nov. 8, 1976

Related U.S. Application Data

[63] Continuation of Ser. No. 554,889, March 3, 1976.

[51] Int. Cl.$^2$ .................. H03K 5/00; H01L 29/78; H01L 29/04; G11C 11/24
[52] U.S. Cl. ................................. 307/238; 357/24; 357/91; 357/59; 365/183
[58] Field of Search ............... 357/24, 91; 307/238, 307/304, 221 D; 340/173 CA

[56] References Cited

U.S. PATENT DOCUMENTS

| | | | |
|---|---|---|---|
| 3,533,089 | 10/1970 | Wahlstrom | 357/24 |
| 3,720,922 | 3/1973 | Kosonocky | 357/24 |
| 3,789,267 | 1/1974 | Krambeck et al. | 357/24 |
| 3,796,932 | 3/1974 | Amelio et al. | 357/24 |
| 3,811,076 | 5/1974 | Smith | 307/238 |
| 3,911,464 | 10/1975 | Chang et al. | 357/24 |
| 3,918,997 | 11/1975 | Mohsen et al. | 357/24 |
| 4,014,036 | 3/1977 | Ho et al. | 357/24 |
| 4,017,883 | 4/1977 | Ho et al. | 357/24 |

OTHER PUBLICATIONS

Engeler et al., "A Surface-Charge Random-Access Memory System," IEEE, J. Solid-State Circuits, vol. SC-7, (10/72), pp. 330-335.
Ho et al., "Reach-Through Mode Operation of Single-Electrode...Memory Cell," IBM Technical Disclosure Bulletin, vol. 15 (7/72), pp. 412-413.
Bhatia et al., "Irradiation Technique for Making Single Electrode Charge Coupled Storage Cell," IBM Tech. Disclosure Bulletin, vol. 15 (8/72), pp. 723-724.
Ho et al., "Single-Electrode One-Device Cell," IBM Tech. Disclosure Bulletin, vol. 15 (11/72), pp. 1765-1766.
Chiu, "One-Device Memory Cell with Step Oxide Structure," IBM Tech. Disclosure Bulletin, vol. 14, (4/72), pp. 3359-3360.
Spampinato et al., "Single Electrode One-Device Cell," IBM Tech. Disclosure Bulletin, vol. 15 (11/72), pp. 2019-2020.

*Primary Examiner*—William D. Larkins
*Assistant Examiner*—Gene M. Munson
*Attorney, Agent, or Firm*—James T. Comfort; Charles J. Fassbender

[57] ABSTRACT

Semiconductor memory cells include gate conductor-insulator-semiconductor regions having storage and transfer portions in which the threshold voltage and surface potential-gate conductor voltage characteristics differ as between the storage and transfer portions. This may be achieved by employing relatively thick and relatively thin insulator areas at the storage and transfer portions, or vice versa, with a surface charge accumulation layer at the semiconductor region insulator interface. In a different form of cell structure, the insulator is a uniform thickness layer overlying the storage and transfer portions one of which includes a doped semiconductor region of the same conductivity type as, but higher dopant concentration than, the remainder of the semiconductor region. The difference in threshold voltage and surface potential characteristics is such that in response to first and second defined gate voltage levels, the potential well profile at the storage and transfer portions is changed in a manner permitting write in and read out of logic signal level related charge packets into and from the storage portion. Semiconductor memories include a matrix array of such cell structures, the gate conductor of a line of cells in the matrix forming part of a store/word conductor common to that line and a sense portion of each cell may form part of a common sense line for a line of cells extending perpendicularly to the store/word conductors. The memory cells may be fabricated by a process utilizing photolithographic alignment offset and self-aligning techniques in conjunction with diffusion and ion implantation techniques.

20 Claims, 23 Drawing Figures

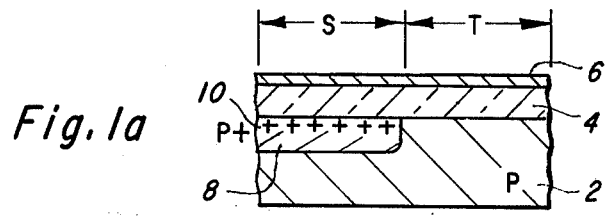
Fig. 1a
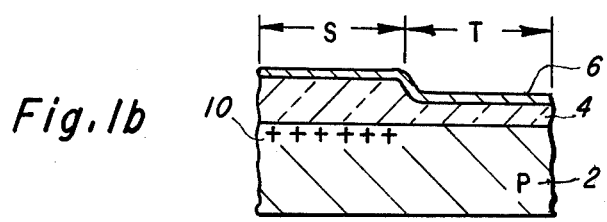
Fig. 1b
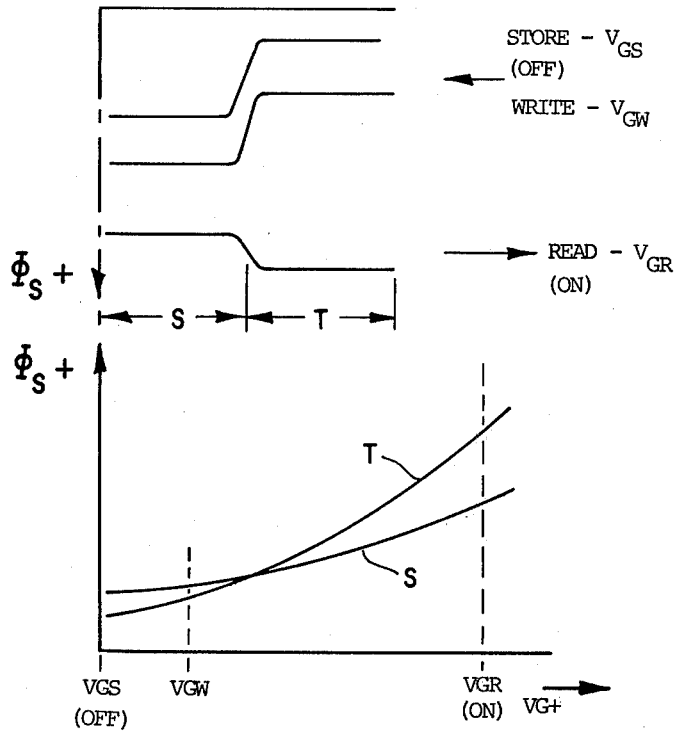
Fig. 1c
Fig. 1d

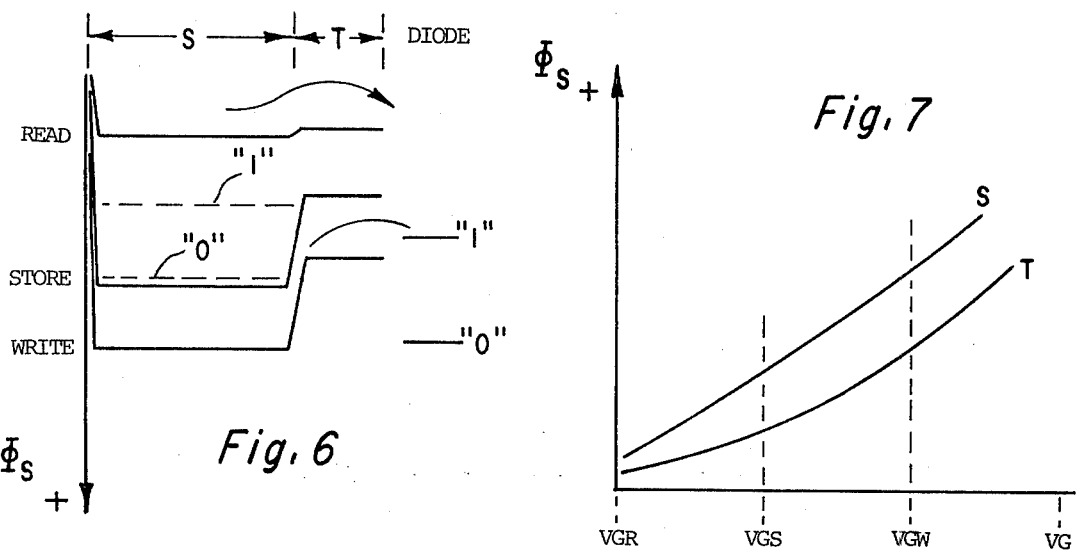
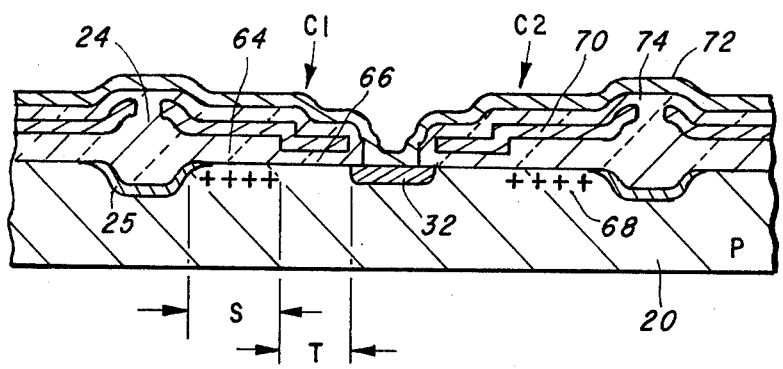
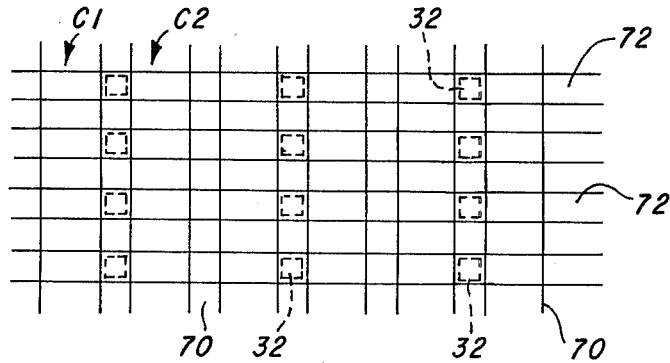
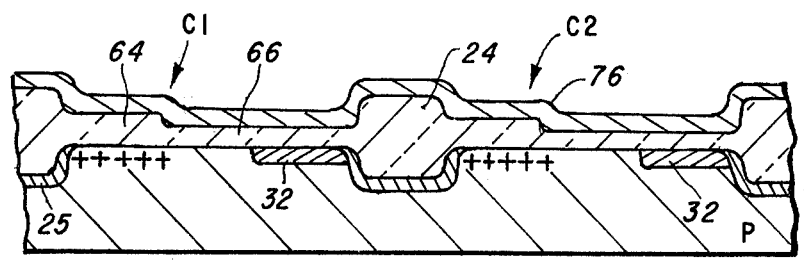

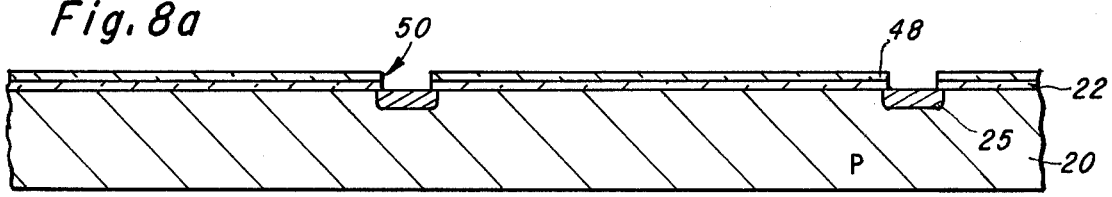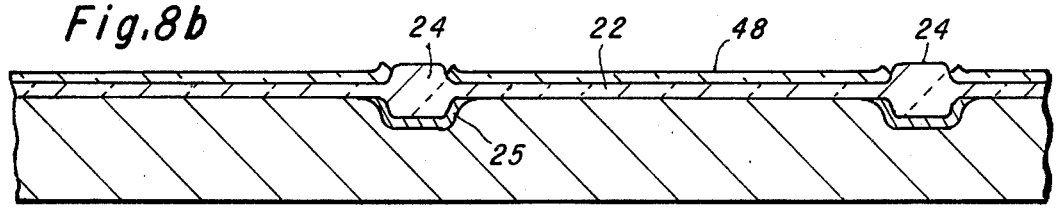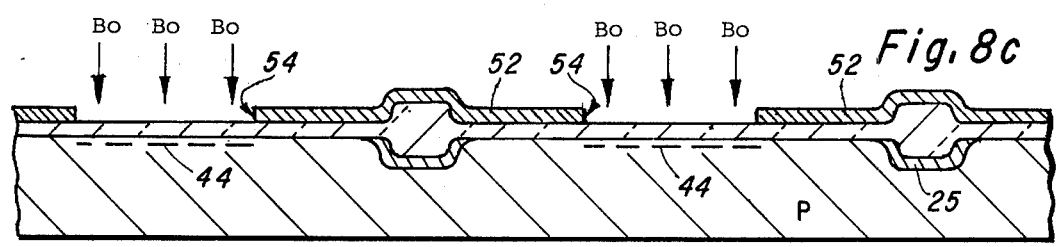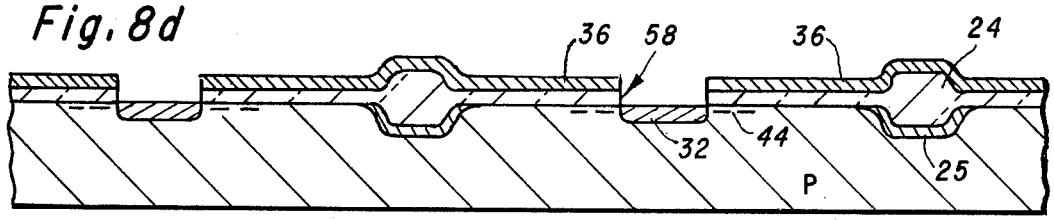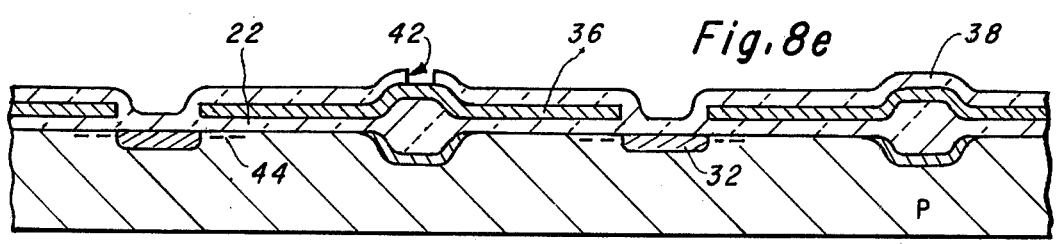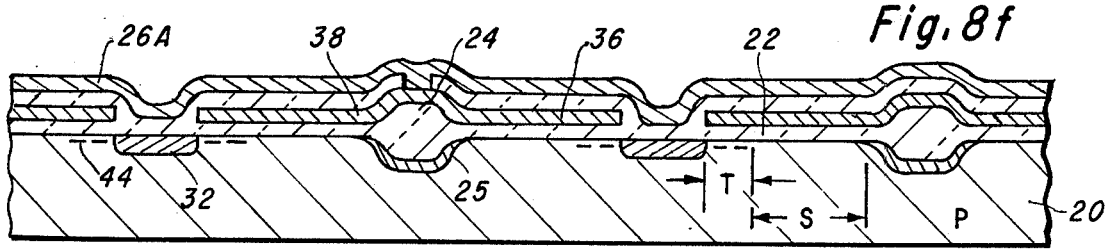

CHARGE COUPLED DEVICE RANDOM ACCESS MEMORY

This is a continuation of application Ser. No. 554,889, filed Mar. 3, 1976.

This invention relates to semiconductor memories and in particular to charge coupled device random access memories.

U.S. Patent Application Ser. No. 545,954, filed Jan. 31, 1975 for Uniphase Charge Coupled Devices by Robert Charles Frye et al, and assigned to the assignee of the present invention, describes and claims a charge coupled device including a channel overlaid by a continuous gate electrode and operable by a uniphase clock pulse source. The present invention utilizes concepts as taught in said co-pending application and the disclosure thereof is incorporated herein by reference.

MOS RAM's are currently in extensive use. Such memories typically feature relatively small cell size with each cell comprising a single transistor and associated storage, word and sense lines.

It is an object of the present invention to provide a novel semiconductor memory cell that is relatively simple in structure and manner of operation and that can be used in fabrication of a high density memory device.

A memory cell according to the present invention comprises a gate conductor-insulator-semiconductor region including a storage portion and an adjacent transfer portion, with at least part of the gate conductor electrically coupled to both of said storage and transfer portions for receiving clock pulses to create potential wells at the storage and transfer portions. A sense portion of the semiconductor region is located adjacent to said transfer portion for receiving signal charge corresponding to logic 1 and logic 0 signal levels that are to be written into the storage portion or that are read out from the storage portion. The memory cell is based on a so-called uniphase charge coupled device (CCD) concept and the conductor-insulator-semiconductor region at the storage and transfer portions of the cell have different threshold voltage and semiconductor surface potential-gate voltage characteristics. These characteristics are so selected that in response to a selected first clock pulse level applied to the gate conductor, potential wells of different depths are created at the storage and transfer regions of the cell, with the potential well at the storage portion being sufficiently deeper than that at the transfer region so that a charge packet corresponding to a logic 1 signal level may be transferred from the sense portion to the storage portion of the cell. To accomplish this transfer, the sense portion is held at a surface potential lower (less positive for case of N-channel) than that of the transfer portion. When a logic 0 is to be stored in the cell, the sense portion is held at a surface potential higher (more positive for N-channel) than that at the transfer portion so that there exists a potential barrier between the sense portion and the storage portion, and no charge packet is transferred into the storage portion. In order to read-out the content of the storage portion, a second clock pulse level is applied to the gate conductor which, due to the differing characteristics at the storage and transfer portions referred to above, creates potential wells at those portions having a lesser difference in depth so that a charge packet corresponding to a logic 1 signal level in the storage portion may transfer to the sense portion which is held at a surface potential that creates a potential well for receiving charge from the storage portion. In the event a logic 0 signal is present in the storage portion, no transfer of charge to the sense portion takes place.

A semiconductor memory may be fabricated using a matrix of cells as described in the preceding paragraph, the cells being arranged in lines with the gate conductors of each line of cells forming parts of a common store/word conductor for that line. Lines of said cells extending in a perpendicular direction may share a common sense portion which may be defined by an elongated diode region in the semiconductor substrate. Entry of a logic signal level only into the proper cell of a line of cells sharing a common sense portion is assured by holding the store/word conductors of the other cells in that line, during the write operation, at a level such that the surface potential at transfer portions of those cells presents a potential barrier even to a logic 1 signal level on the sense portion.

Various forms of memory cell structure are possible within the general concept of the invention. For example, each cell may include a uniform thickness insulator layer at the storage and transfer portions of the cell, with either the storage or the transfer portion including a doped semiconductor region of the same conductivity type as, but higher dopant concentration than, the remainder of the semiconductor region of that cell. This doped region, in conjunction with a surface charge accumulation layer at the interface thereof with the insulator layer, serves to provide the threshold voltage and surface potential-gate voltage characteristics referred to above. In another embodiment, these characteristics are provided by defining relatively thick and relatively thin insulator areas at the storage and transfer portions, or vice versa, of each cell, together with a surface charge accumulation layer at the interface of the semiconductor region and the insulator layer.

In a semiconductor memory incorporating a matrix of cells according to the present invention, the cell areas may be defined by use of channel stops to define enclosed areas for the cells. In one embodiment, the cells are accommodated one to each enclosed area and in an alternative embodiment, pairs of cells are accommodated by each enclosed area, each pair of cells sharing a single sense portion. In both arrangements, lines of cells in the matrix array may share a common sense portion. Logic output signals may be derived using CCD output structures coupled with the sense portions of the respective lines of the matrix array.

A semiconductor memory may be constructed embodying the present invention with a high density of cells which themselves may be small dimensioned, cell areas on the order of 0.5–1.0 mil$^2$ being possible using contemporary photolithographic techniques. These structures may be fabricated using available photolithographic alignment offset and self-alignment techniques together with diffusion and ion implantation doping techniques. Memory arrays may be fabricated using a single level of metal conductors, thereby effecting fabrication simplification or, if so desired double-level conductor techniques, e.g. employing polysilicon and metal conductors may be utilized in order to simplify interconnections with peripheral circuits formed on the same semiconductor substrate and to fully exploit the density advantages associated with this invention.

DESCRIPTION OF THE INVENTION

In order that the invention may be more readily understood and put into effect, embodiments thereof will be described in greater detail with reference to the drawings, wherein:

FIGS. 1a-1d illustrates the basic structures of memory cells embodying the invention together with functional characteristics thereof;

FIGS. 6 and 7 depict functional characteristics associated with the memory cells shown in FIGS. 4 and 5;

FIGS. 8a-8f represents a section underlying 5—5 of FIG. 4 at various progress steps during fabrication of that cell structure;

FIGS. 9, 11, 13 and 14 are cross sections of further memory cell structures embodying the present invention;

FIGS. 10 and 12 depict plan diagramatic representations of portions of a matrix array of memory cells as shown in FIGS. 9 and 11, respectively.

Figure 2:
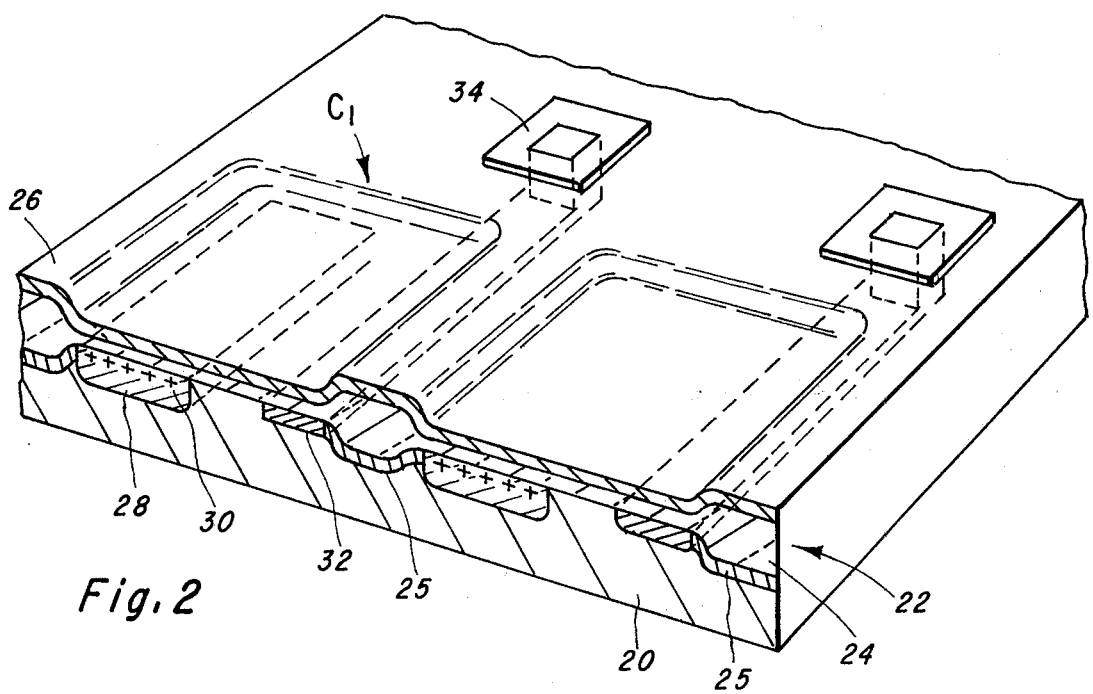
FIG. 2 is a view, partly in section, of part of a matrix array of memory cells according to a specific embodiment of the invention.

The embodiments of the invention to be described feature a RAM cell comprising a conductor-insulator-semiconductor region structure defining adjacent storage and transfer portions and employing the charge-coupling concept in a manner to permit transfer of charge, representing logic signal levels, into and out of the storage portion via the transfer portion. Of particular significance is the use of a single storage and word conductor associated with the storage and transfer portions to control the necessary charge transfer process in response to adjustment of the pulse levels of uniphase clock pulses applied through the common storage and word conductor. The manner in which this process may be realised is illustrated by FIG. 1.

FIG. 1A shows a p-type semiconductor region 2 overlaid by a uniform thickness insulator 4 and a gate conductor 6. Extending over part of the semiconductor region adjacent to the insulator 4 is a p+ doped region 8, with an n-type charge accumulation layer 10 in the region 8 at the interface with the insulator layer 4. In FIG. 1B, the semiconductor region 2 has an overlying stepped insulator layer 4, with an n-type charge accumulation layer 10 at the interface between the semiconductor region 2 and the thicker portion of the insulator layer. Thus, in each of the structures shown in FIGS. 1A and 1B, the conductor-insulator-semiconductor region has two portions, respectively designated S and T, with the threshold voltage in portion S differing from that in portion T; in FIG. 1A due to the presence of the doped region 8 at the portion S and in FIG. 1B due to the thicker insulating layer at the portion S. Furthermore, the surface charge accumulation layer 10 serves to shift the gate voltage-surface potential ($\phi$s) characteristic at portion S relative to that at portion T, as illustrated by FIG. 1D from which it may be noted that the characteristics of the two portions S and T, intersect each other. The characteristics are so designated that with the gate voltage OFF, the surface potential at the portion T is less positive than at portion S, so that a potential well for minority charge carriers (electrons) exists at the portion S. Thus, with the gate voltage at a low positive volt value, VGW, a logic input can be written into the potential well at the portion S for storage therein. A logic 1 is written by entering a preselected size charge packet into the potential well at portion S, whereas a logic 0 is written by not entering a charge packet into the potential well. When the gate voltage is switched to a more positive ON condition, the surface potential at the portion T changes in a positive direction more rapidly and by a greater amount than at portion S, so that a deeper potential well is created at portion T than at portion S. Thus, by application of a suitable gate voltage level VGR, a logic signal stored in portion S can now be read out via the portion T.

In relation to FIGS. 1A and 1B, the surface charge accumulation layer 10 may be formed to extend across both of the portions S and T. Also, instead of the n-channel structure described, a p-channel structure may be used, in which case the semiconductor region 2 and doped region 8 would be $n$ and $n+$ type, respectively, and the surface charge accumulation layer would be p-type to provide an induced negative charge layer. In such a structure, the polarities of the surface potentials and of the clock pulses also would be reversed.

FIG. 2 illustrates two memory cells of a semiconductor RAM embodying the invention. The RAM has a p-type semiconductor substrate 20 with an insulating surface layer of silicon oxide 22, including frame shaped thickened portions 24 defining the boundaries of the individual memory cells which are disposed in a matrix array of rows and columns in the usual manner. Beneath the thickened insulating layer portions 24 is a p+ doped layer 25 forming a channel stop layer. Within the area of each cell, the insulating layer is relatively thin and uniform in thickness. A conductive layer 26 extends over a complete row of cells to provide a common storage and word line for that row. Each cell includes a conductor-insulator-semiconductor region defining a storage portion S and an adjacent transfer portion T, as previously described with reference to FIG. 1A. The storage portion includes a p+ doped region 28 with an n-type charge accumulation layer 30 (indicated by a positive space charge layer) in the surface of the region 28 at its interface with the insulator layer 22. The transfer portion T is located between the region 28 and an $n+$ doped region 32 adjacent to one of the thickened insulating layer portions 24, the region 32 extending orthogonally to the conductive layer 26 to provide a sense line (diode) common to a column of cells in the matrix array. Electrical contact is made to one end of the sense region 32 by a contact pad 34 disposed on the insulating layer 22. Thus, a particular cell may be addressed by appropriate voltage levels applied to the storage and word line, and to the sense line associated with that cell in order to write logic information into the cell and read out logic information from the cell. The electrical functional characteristics of the conductor-insulator-semiconductor region of each cell have been described in relation to FIGS. 1A, 1C and 1D and the description of the write, store, and read functions associated with operation of a RAM, including cells as illustrated by FIG. 2 now follow.

Figure 3:
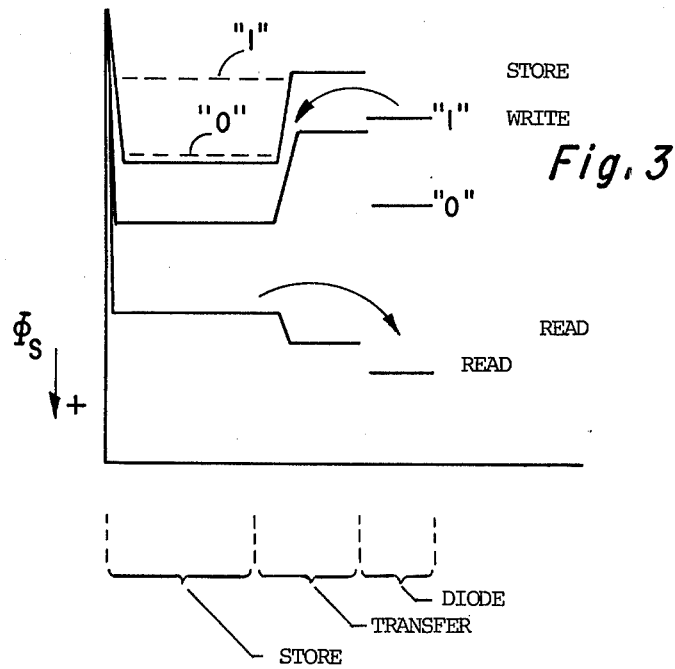
FIG. 3 illustrates functional characteristics associated with the memory cells shown in FIG. 2.

It will be assumed that logic information is to be written into the cell C1. This is accomplished by applying a gate clock pulse of amplitude VGW to the store and write conductor 26. As will be seen from FIG. 1C, the surface potential at the storage portion S is then more positive than at the transfer portion T, so that a potential well is formed at the storage portion S which is deeper than that formed in the portion T, as shown in FIG. 3. In order to enter a logic 1 into the cell C1, a low positive voltage is applied to the diode contact 34 so that the surface potential of region 32 is less than that at the transfer portion, permitting minority charge carriers (electrons) to pass from the diode through the transfer region T into the potential well under the storage portion S of the cell C1. A logic 0 is entered by applying a high positive voltage to the contact 34, so that the surface potential at the transfer portion T provides a potential barrier preventing transfer of charge carriers from the sense diode 32 into the storage portion S. Suitable high and low diode potential levels are illustrated in FIG. 3. Following the write operation, the gate clock pulse level is reduced to a value VGS (FIG. 1C) thereby decreasing the surface potentials at both the storage and transfer portions S and T, so that the transfer portion surface potential provides a potential barrier preventing entry of charge into the cell C1 when another cell in the same column is addressed. In order to read out logic information stored in the cell C1, a clock pulse level VGR is applied to the write and store conductor 26 and the sense diode 32 is reverse biased by a high positive potential applied to the contact 34. Referring to FIG. 1C, it will be noted that the surface potential at the transfer region T is now higher than that at the storage portion S, giving rise to a deeper potential well at the transfer portion T than exists at the storage portion S, as shown in FIG. 3. The sense diode surface potential is at an even higher positive level, so that the charge may transfer from the storage portion S through the transfer portion T to the sense diode 32. If a logic 1 signal had been stored in cell C1, a corresponding charge packet would be transferred to the sense diode while if a logic 0 had been stored, no charge packet would be transferred; corresponding logic level voltages thereby appear at the contact 34. Typical operating values are VGW = +5 volts, VGS = 0 volts, VGR = +15 volts; the sense diode may be biased at +4 volts and +8 volts for writing logic 1 and logic 0 inputs, respectively, and at +15 volts during the read operation.

In comparison with conventional MOS RAM cells, the structure shown in FIG. 2 offers advantages in respect of fabrication simplicity and ease of layout with the prospect of increased yield and density factors.

Figure 4:
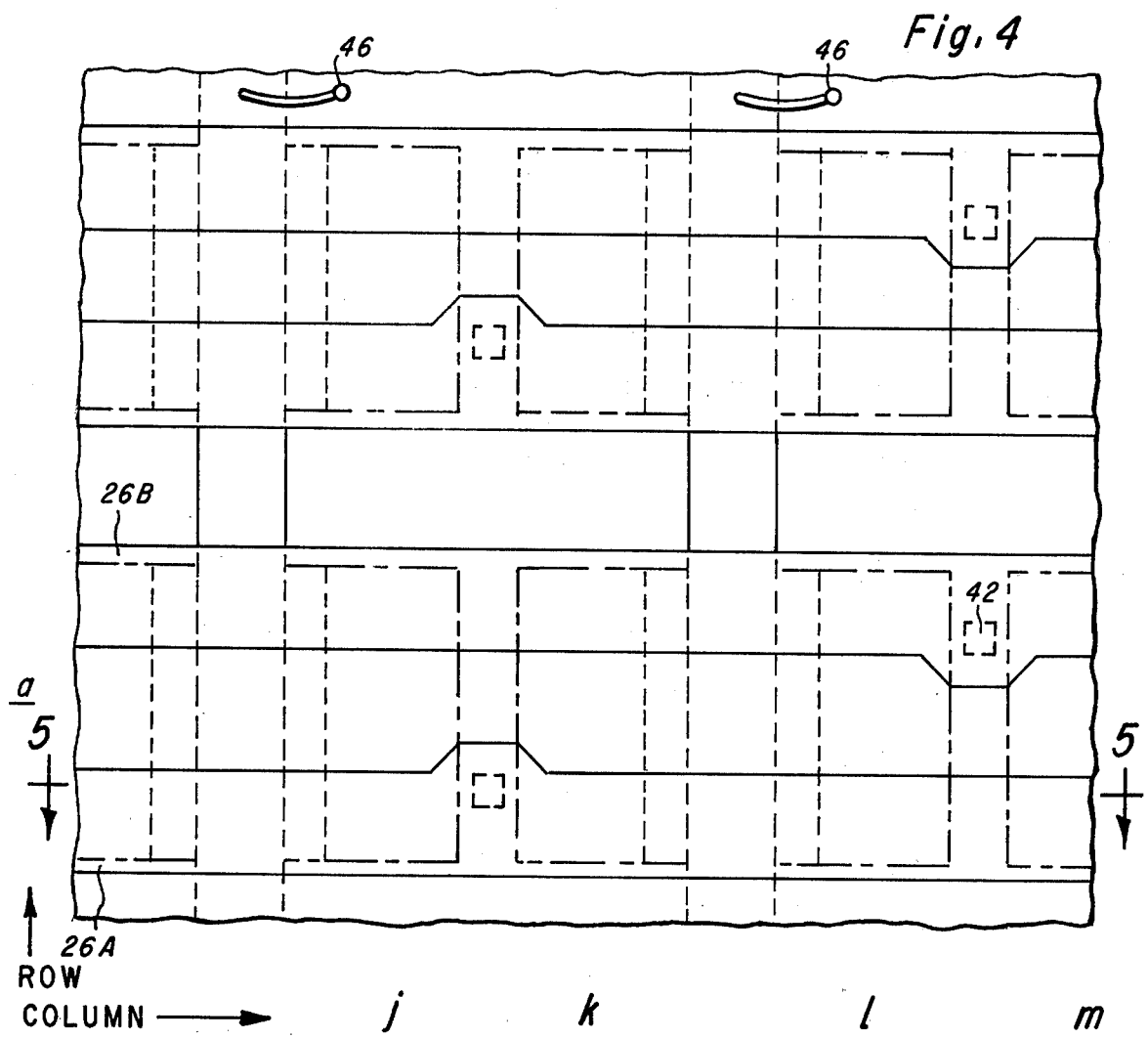
FIG. 4 is a diagramatic top plan view of part of a matrix of memory cells according to another, preferred embodiment of the invention.
Figure 5:
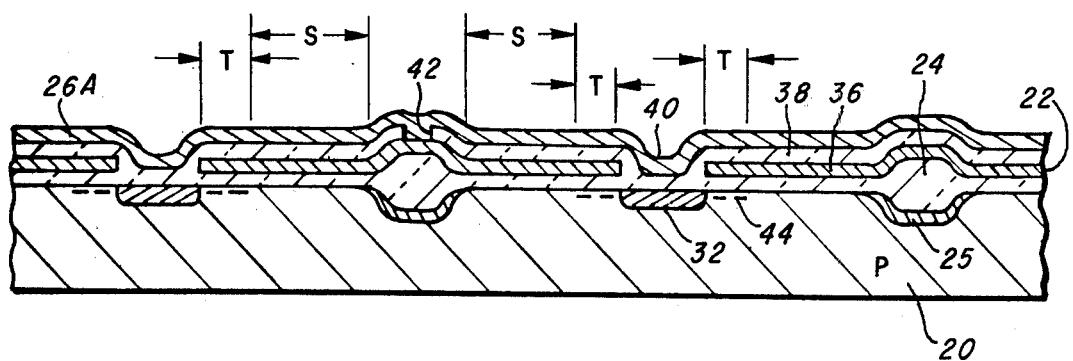
FIG. 5 is a section underlying 5—5 of FIG. 4.

FIGS. 4 and 5 illustrate part of another RAM matrix embodying the present invention and including a p-type semiconductor substrate 20 with an insulator layer 22 having locally thickened frame shaped areas 24 underlaid by p+ channel stop layer 25, as in FIG. 2. However, in the structure shown in FIGS. 4 and 5, each thickened insulating layer frame area accommodates a pair of RAM cells and each sense diode 32 is common to two columns of cells, being located adjacent the transfer portions T of the cells in each column. Each row of cells has associated therewith two storage/write conductors 26A and 26B coupled with alternate pairs of cells. In this manner, a single cell may be addressed by application of appropriate voltage levels to the store/write conductor and the sense diode associated with that cell.

Along each row of cells, individual conductive polysilicon layers 36 on the insulator layer 22 extend over thick insulator layer portions 24 to overly the transfer and storage portions of cells adjacent columns of the matrix, e.g. in row a, of columns j, k and l, m. An insulating layer 38 overlies the polysilicon layers 36 and regions 40 of insulating layer 38 provide separation between the polysilicon layers 36 associated with the cells accommodated by each thickened insulating layer frame area, e.g. in a row a, between the cells of columns k and l. Along each row of cells, the polysilicon layers 36 are electrically connected, alternately with the write/store conductors 26A and 26B through apertures 42 in the insulating layer 38. Thus, in row a, conductor 26A is connected with layer 36 of rows j and k, whereas conductor 26B is connected with the layer 36 of rows l and m.

The transfer portion of each cell incorporates a p+ doped region 44 (negative space charge layer) resulting in different gate voltage-surface potential characteristics at the storage and transfer regions S and T as depicted by FIGS. 6 and 7, it being noted that as shown in FIG. 7 the characteristics of the two regions do not intersect each other over the operative range of VC. However, with increasingly positive values of gate voltage, the surface potential of the storage region S initially increases more rapidly than that at the transfer region T. This characteristic is utilized in operation of the RAM cell structure as explained below.

To write a logic signal into a cell, a relatively high positive gate voltage VGW is applied to the row conductor connected to the polysilicon layer 36 of that cell, e.g. to the conductor 26A of row a to address the cell in column k along that row. The surface potential at the storage region S of that cell is then more positive than that at the transfer portion, giving rise to a corresponding potential well profile as shown in FIG. 6, so that a logic input can be written into the storage portion S from the sense diode 32 adjacent to the transportion of that cell. A logic 1 is entered by pulsing that sense diode with a relatively low positive potential, to create a surface potential lower than that at the transfer portion, as shown in FIG. 6, so that a minority carrier charge packet can be transferred from the sense diode 32 into the storage portion of that cell. A logic 0 is entered by pulsing the sense diode 32 at a high positive potential, so that the surface potential at the transfer portion provides a potential barrier between the sense diode and the storage portion S, and consequently no charge packet can be transferred from the sense diode. After a logic input has been written into the cell, the write/storage conductor voltage is decreased to a level VGS so that the transfer portion surface potential presents a potential barrier higher than that of the adjacent sense diode 32 even when the latter is pulsed to a logic 1 signal level. Consequently, when the sense diode 32 is pulsed to a logic 1 level, a corresponding input can be written only into a cell having an associated store/word conductor held at a write level VGW.

Logic signals stored in the cell are read out by applying a still lower positive gate voltage VGR to the store/word conductor 26A. Due to the different gate voltage-surface potential characteristics of the storage and transfer regions, the difference in depth between the potential wells at the two portions is reduced to a small value, but that at the storage portion remains slightly deeper (typically <0.5v) than that of the transfer portion as shown in FIG. 6. This difference is sufficiently small that a charge packet corresponding to a logic 1 1 stored in the storage portion S transfer to the sense diode 32, which during the read out operation is pulsed at a suitable high positive voltage. When a logic 0 (no charge packet) is stored, clearly no charge will be transferred to the sense diode 32 during the read-out process. In either event, a corresponding logic signal output level is generated at the sense diode terminal 46.

Use of the metal/polysilicon, write/storage conductor structure as shown in FIGS. 4 and 5 is advantageous in that it permits two level interconnections to be made to peripheral circuitry formed on the semiconductor substrate 20, thereby economizing in the required area of the semiconductor substrate. However, it is possible to use a single level gate conductor, in which case the RAM cells would be disposed in individual insulating layer framed areas in the same manner as depicted in FIG. 2. Such a structure would involve corresponding process simplification, but would require an increased area of semiconductor substrate in order to accommodate necessary interconnectants with peripheral circuits.

A suitable manner of fabrication of a RAM as shown in FIGS. 6 and 7 will now be described with reference to FIG. 8 which shows a sectional view corresponding to FIG. 7 during various stages of the manufacturing procedure. A p-type silicon substrate 20 having a resistivity of about 5 to 20 ohm-cm has an upper surface covered by a thermally grown silicon oxide layer about 1,000 A thick which in turn is covered by a silicon nitride layer 48 about 1000 A thick. Apertures 50 are photolithographically patterned in the insulating layers 22 and 48 and a boron deposition or implantation step carried out to define p+ type surface layers 25 in the surface areas of the silicon substrate 20 exposed by the apertures 50, as shown in FIG. 8A. The substrate is then subjected to a further thermal oxidation step to grow silicon oxide over the substrate surface in the apertures 50 resulting in thickened frame shaped silicon oxide areas 24 extending into the surface of the substrate 20 as shown in FIG. 8B. The regions 25 diffuse into the substrate at the interface with the silicon oxide areas 24. The silicon nitride layer 48 is then stripped together with the underlying areas of the silicon oxide layer 22 and a fresh silicon oxide layer about 1000 A thick is thermally grown in between the thickened oxide areas 24. A photoresist ion implantation mask 52 is then defined over the oxide layer 22 having apertures 54 photolithographically patterned therein, corresponding to the sites of the transfer regions T of the RAM cells, and p-type, e.g. boron, ions are implanted, suitably using a beam energy of 40–60 KEV for 1000 A $SiO_2$ and a dosage of 1 to $2 \times 10^{12}$ to implant a space charge layer 44, as shown in FIG. 8C. The photoresist mask 52 is then stripped and a polysilicon layer about 4500 A thick is then deposited and photolithographically patterned to define the polysilicon layers 36, apertures 58 being opened in the areas of the silicon oxide layer 22 underlying the gaps between the polysilicon layers 36. An n-type, e.g. phosphorous, diffusion or implantation step is then carried out to define the n+ —type diode regions 32, as shown in FIG. 8D, this step also serving to dope and thereby increase the conductivity of the polysilicon layers 36 and permitting the fabrication of self-aligned MOSFETS of peripheral circuits in the substrate 20. A silicon oxide layer 38 is then formed to overly the polysilicon layers 36 and close the apertures 58. The silicon oxide layer 38 is about 4000–8000 A thick and may be formed by thermal growth, oxide deposition or a combination of both processes. Apertures 42 are opened in the silicon oxide layer 38 as shown in FIG. 8E. A metal layer is then deposited and photolithographically patterned to define the write/storage conductors 26. Only the conductor 26A is shown in FIG. 8F, but row conductors 26B are formed at the same time and in similar manner. During this metal patterning step, contacts 46 to the diodes 32 are also defined.

For the structure as shown by FIGS. 4 and 5, a cell size of about 0.5–1.0 seq. mils can readily be obtained with conventional photolithograhy using the process as described with reference to FIG. 8. Typical operating values for the VG are VGW = 15 volts, VGS = 10 volts, and VGR = 0 volts. Suitably, the diode 32 may be biased to +7 volts to write in a logic 1; to +12 volts to correspond to a logic 0 input signal; and to +15 volts during the read operation. Suitably, the substrate 20 is biased at −3 to −5 volts, although this is not critical.

FIG. 9 shows a cross section of two cells of a RAM matrix in accordance with another embodiment of the invention. The basic cell structure and operating principles thereof have been described with reference to FIG. 1B. The p-type silicon substrate 20 has an overlying surface layer 22 of silicon oxide, locally thickened portions 24 of which define a matrix of framed areas, each accommodating two cells of the RAM structure. As shown in FIG. 9, within a frame area, two cells are positioned, one on either side of an n+ —type diode region 32 common to both cells. The storage portion S of each cell includes a locally thickened area 64 (suitably within the range 3000–6000 A and typically about 4,000 A thick) of the silicon oxide layer 22 while the transfer portion includes a relatively thin (suitably about 1,000 A thick) portion 66 thereof. An ion implanted n-type layer 68 defines a positive surface charge accumulation layer at the storage portion S. A polysilicon store/word line 70 extends over the oxide portions 62 and 64 of a cell in a direction perpendicular to the plane of the drawing so that the line 70 is common to a column of cells in the RAM matrix. A sense line 72, insulated from the storage word line 70 by an intervening silicon oxide layer 74 extends along a row of cells in the RAM matrix and is ohmically connected with the diode region 32 of each cell in that row. Operation of a RAM matrix structure incorporating cells as shown in FIG. 9 is similar to that described previously. Thus, entry of a logic 1 into the cell C1 shown in FIG. 9 is accomplished by holding the storage and word line 70 at a voltage VGW (see FIG. 1D) with the sense diode 32 pulsed such that the surface potential thereof is less positive than that of the transfer portion T, so that charge can transfer into the storage portion S. A logic 0 is entered by pulsing the diode 32 to a high positive value so that the surface potential of the transfer portion provides a surface barrier preventing transfer of charge into the storage portion S. Following the write operation, the storage and word line 72 is held at a less positive voltage VGS to prevent spurious entry of a logic 1 input into that cell when the other cell C2, common to the diode region 32, is being addressed. Read-out is accomplished by holding the storage and word line 72 of cell C1 at a high positive voltage VGR while the diode region 32 is held at a higher positive potential resulting in a potential well contour as shown in FIG. 1C, so that charge can transfer from the storage portion S of cell C1 into the sense diode 32 giving rise to a corresponding potential on the sense line conductor 72. The architecture of a matrix of RAM cells as shown in FIG. 9 is diagrammatically depicted in FIG. 10.

FIG. 11 shows a RAM cell structure according to a further embodiment of the invention. This structure is a simplified version of that shown in FIG. 9 and employs a single level of metallization. In FIG. 11, portions that correspond with like portions in FIG. 9 are identified by the same references and further description thereof will not be given. It will be noted that in FIG. 11, only one RAM cell is accommodated by each locally thickened silicon oxide frame area 24. The sense diode 32 is common to a column of cells and includes an ohmic contact at one end thereof provided in the same manner as the contact 34 shown in FIG. 2. The thin silicon oxide portion 66 also extends over the sense diode 32 and a storage and word line conductor 76 on the oxide layer is common to a row of cells. Write, storage and read operations are similar to those described with reference to FIG. 9. A RAM matrix architecture is depicted by FIG. 12.

Figure 12:
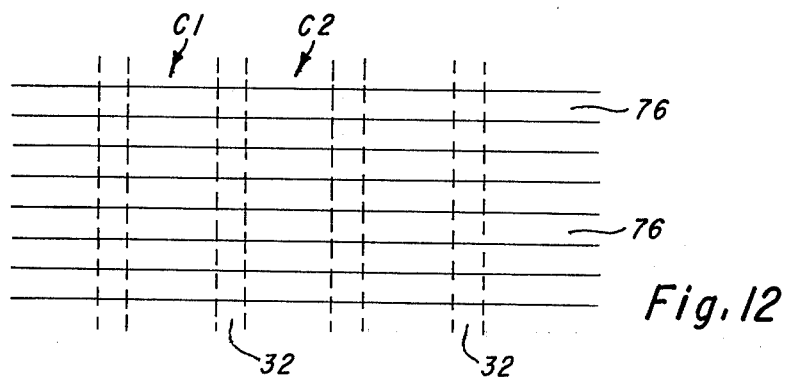
Figure 13:
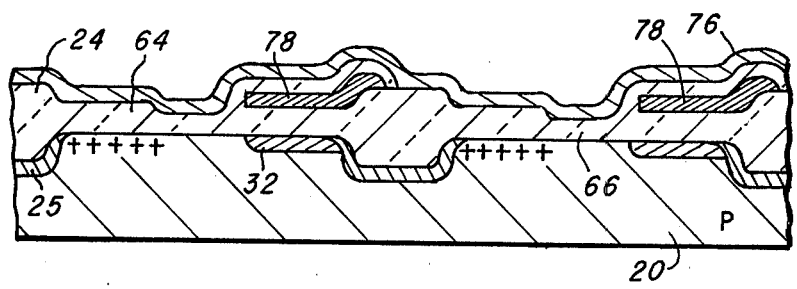

FIG. 13 is a section of RAM cell in accordance with a further embodiment of the invention and is a modification of the structure shown in FIG. 12; again like references are used where appropriate. The structure shown in FIG. 11 differs from that shown in FIG. 10 essentially in that a polysilicon sense line 78 is located between and insulated from the sense line diode 32 and the storage and word line 76. The sense line 78 is not ohmically connected to the diode region 32 and operating voltages applied thereto induce corresponding surface potential levels at the diode region through the capacitive coupling between the line 78 and the underlying diode region 32. In fact, the diode region 32 is not essential and may be omitted so that the sense line 78 acts as a charge transfer electrode in well-known manner. RAM matrix architecture will be apparent from the previous description. Operating voltage for FIGS. 9–13 correspond with those described in relation to FIG. 2.

Figure 14:
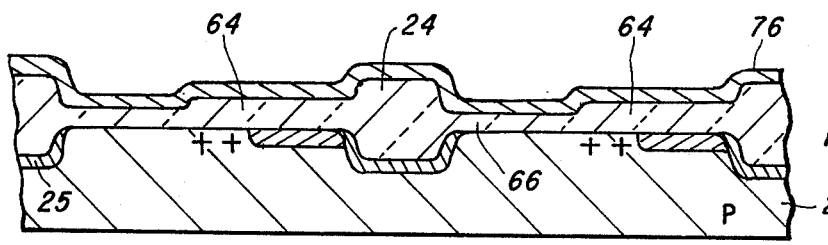

FIG. 14 shows a further modification of the structure shown in FIG. 11 wherein the thick silicon oxide region 64 is located at the transfer portion of the storage cell and the thin silicon oxide region 62 is located at the storage portion of the cell; additionally, while the charge accumulation layer 68 is located at the interface between the semiconductor substrate 20 and the thick oxide portion 64 at the transfer portion. Operation of the cell is similar to that described with reference to FIG. 11 and the RAM matrix architecture is the same as depicted by FIG. 12. Operative voltages correspond to those described with reference to FIGS. 4 and 5.

Each of the above-described RAM cell structures is characterized by constructional simplicity and small area. Although described with reference to an n-channel structure, clearly a p-channel structure could be utilized with appropriate changes in conductivity types of the various regions and of the operating voltages. Furthermore, silicon gate or refractory metal gate structures could be employed in place of the metal conductor layers described. Application of such structures may advantageously employ a judicious combination of photolithographic alignment offset and self-aligning procedures, for example, as described with reference to FIG. 8, to achieve very high cell densities in the overall RAM structure.

In order to enhance the advantage of the capability to fabricate RAM structures having a very high cell density, by employing cell structures according to the present invention, it is preferable to utilize an output sense amplifier which has the capability of detecting small signal charge levels. One suitable sense amplifier structure is illustrated schematically in FIG. 15 and such an output amplifier would be associated with each sense line of the RAM matrix. As shown in FIG. 5, an output diode is defined in the p-type substrate 20 by an $n+$ doped region 80. Region 80 is ohmically connected to the gate of a source follower IGFET output amplifier Q1 and to the source of an IGFET Q2, the gate of which is connected to receive pre-charge pulses $\phi_{PC}$, the drain of the transistor Q2 being connected to a suitable reference voltage $V_{REF}$. An output gate 82 is disposed on the silicon oxide layer 22 to overlap one end of a sense diode region 32 in a structure as shown in FIGS. 2, 4 and 5 and 12. In relation to the structure shown in FIG. 11, the output gate 82 is disposed adjacent to one end of the sense line conductor 76. To operate the output circuit, the node A is precharged to a preselected value $V_{REF}$ by a positive clock pulse $\phi_{PC}$ applied to the gate of transistor Q2. The charge to be detected by the output amplifier is then transferred from the sense line of the RAM (as will be described below) to discharge the node A by an amount dependent on whether a logic 1 or logic 0 signal is being transferred from the sense line. Since the node A can be fabricated to have a very low capacitance (0.07 pf has been achieved), the voltage change due to the signal charge is relatively large, e.g. for 0.07 pf at node A, a sensitivity of approximately $2\mu v$/electron is obtainable. A typical worst case condition might give rise to a signal size of about 80 mv at the node A which is adequate to generate a suitable logic 1 or logic 0 output at the output terminal $V_o$ of the source follower amplifier Q1.

Figure 15:
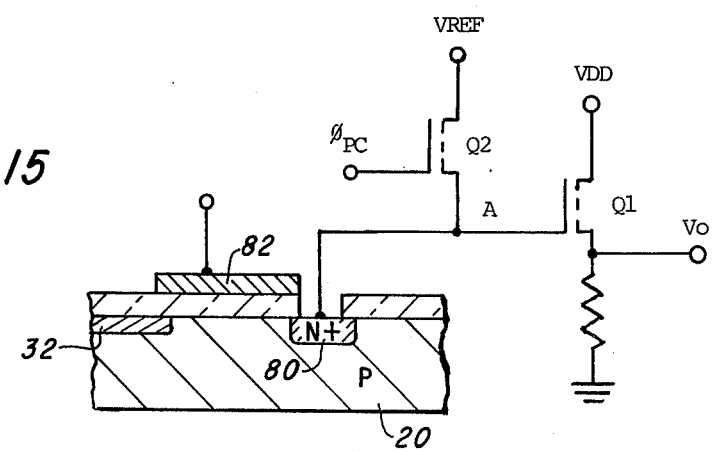
FIG. 15 is a diagramatic representation of an output sense amplifier suitable for use in conjunction with memory cell arrays embodying the present invention.

Signal charge is transferred from a RAM sense line to the node A of the output amplifier as follows. In relation to the embodiments shown in FIGS. 2, 4 and 5, 10 and 12, the output gate 82 overlies one end of the sense diode region 32 as shown in FIG. 15 and, following precharging of the node A as described above, a positive pulse is applied to the output gate 82 such that any signal charge present in the diode region 32 is transferred over the output gate onto the node A. The time constant for this transfer is extremely short since the transfer operation involves majority carrier (electron) transfer along the diode region 32 to the node A. An advantage of this arrangement is that no sense line conductor is required in the active RAM area. In relation to the structure shown in FIG. 13, in order to transfer signal charge from beneath the sense conductor 78, the readout voltage applied to that conductor is removed and a positive voltage pulse applied to the output gate 82 sufficient to permit charge to transfer from beneath the sense line 78 preferentially to the node A instead of into other RAM cells.

It is not essential to use a CCD-type output structure to obtain a read-out from any of the memory structures described above. Instead, ohmic connections could be made to the respective sense diodes of the embodiments shown in FIGS. 2, 4–5, 11–12, 13, and 14 for connection directly to the input of sense amplifiers. In the embodiment shown in FIGS. 9 and 10, the sense lines 72 may be connected directly to the inputs of sense amplifier. These sense amplifiers conveniently are provided by MOSIC devices on the substrate 20.

While the invention has been described with reference to specific embodiments, the concept of the invention may be utilised in other embodiments within the scope of the claims.

We claim:

1. A memory cell for a semiconductor memory device, comprising a gate conductor-insulator-semiconductor region, the semiconductor of said region having one conductivity type and including a storage portion and an adjacent transfer portion with at least part of the gate conductor of said region overlying and electrically coupled to both said storage and transfer portions for receiving clock pulses to create potential wells at said storage and transfer portions, the semiconductor of said region further including a sense portion adjacent said transfer portion for receiving signal charge corresponding to logic 1 and logic 0 signal levels for writing into and read-out from said storage portion, and for receiving signal charge corresponding to logic 1 and logic 0 signal levels read-out from said storage portion, the conductor-insulator-semiconductor region at said storage and transfer portions having differing threshold voltage and semiconductor surface potential-gate voltage characteristics such that responsive to a selected first clock pulse level applied to said gate conductor, potential wells of different depths are created at said storage and transfer portions with the potential well at said storage portion being deeper than that at said transfer portion for writing logic signal charge inputs from said sense portion into said storage portion, and responsive to a second selected clock pulse level potential wells having a lesser difference in depth are created at said storage and transfer portions with the potential well at said transfer portion being deeper than that at said storage portion for reading logic signal charge from said storage portion into said sense portion.

2. A memory cell according to claim 1, wherein said insulator includes a relatively thin area at said storage portion and a relatively thick area at said transfer portion, the semiconductor of said region including a layer of immobile charge at the interface with said thick insulator area.

3. A memory cell according to claim 1 including a sense conductor electrically coupled to said sense portion.

4. A memory cell according to claim 3, wherein said sense conductor and said gate conductor are superposed and mutually insulated.

5. A memory cell according to claim 4, wherein one of said sense conductor and gate conductor is a metal conductor and the other is a polycrystalline semiconductor layer.

6. A memory according to claim 1, wherein said insulator includes a relatively thin area at said transfer portion and a relatively thick area at said storage portion, and said storage portion of said cell includes a surface layer of immobile charge of conductivity type opposite to said substrate.

7. A memory according to claim 1, wherein said insulator is a uniform thickness layer; said storage portion of said cell includes a doped substrate region of the same conductivity type and higher dopant concentration than said substrate, and said storage portion includes a surface layer of immobile charge of conductivity type opposite to said substrate.

8. A semiconductor memory comprising a semiconductor substrate having an insulating layer on one surface thereof, said memory including a matrix of cells, each said cell comprising a gate conductor-insulator-semiconductor region, the semiconductor of said region having one conductivity type and including a storage portion adjacent to a transfer portion, said gate conductor comprising a portion of a store/word conductor electrically coupled to and overlying both the storage and transfer portions of a line of said cells, and a portion of said semiconductor of each cell region adjacent said transfer portion defining a sense portion for receiving logic 1 and logic 0 signal charge levels for writing into said storage portion of said cell and for receiving logic 1 and logic 0 signal charge levels read-out from said storage portion under control of clock pulses applied to said store/word conductors, said conductor insulator-semiconductor region of each cell having gate conductor voltage-surface potential and threshold voltage characteristics differing as between said transfer and storage portions of that cell such that in response to a first clock pulse voltage level, differential depth potential wells are created at said transfer and storage portions with the potential well created at the storage portion being deeper than that at the transfer portion to permit entry of logic signal charge inputs into the storage portion of a cell from the sense portion of said cell, and responsive to a selected second clock pulse voltage potential wells having smaller differential depths are created at said transfer and storage portions of that cell with the potential well created at the transfer portion being deeper than that at the storage portion for read-out of binary logic signal charge from the storage portion of that cell to the sense portion thereof.

9. A semiconductor memory according to claim 8, wherein said semiconductor substrate includes isolation means defining areas of said substrate for accommodating said cells.

10. A semiconductor memory according to claim 9, wherein said isolation means includes insulator regions extending into said one surface of the substrate, said insulator regions defining enclosed areas for accommodating said cells.

11. A semiconductor memory according to claim 10, wherein each said area accommodates a pair of said cells.

12. A semiconductor memory according to claim 11, wherein the cells of each said pair of cells share a common sense portion, wherein one cell of each pair in a line of said matrix cells has a common store/word conductor electrically coupled thereto; and wherein the other cell of each pair in said line of cells has a separate common store/word conductor electrically coupled thereto.

13. A semiconductor memory according to claim 12, wherein said sense portion includes an elongated diode region in said substrate, said diode region being common to a plurality of said pairs of cells.

14. A semiconductor memory according to claim 8, wherein said cell comprises a gate conductor-insulator-semiconductor region, said insulator is a uniform thickness layer; said storage portion of said cell including a doped substrate region of the same conductivity type and higher dopant concentration than said substrate and said storage portion includes a surface layer of immobile charge of conductivity type opposite to said substrate.

15. A semiconductor memory according to claim 8, wherein each said cell comprises a gate conductor-insulator-semiconductor region, wherein the insulator has a relatively thick portion at one of said storage and transfer portions of said cell, and a relatively thin portion at the other one of said storage and transfer portions of said cell, and wherein said cell includes a surface layer of immobile charge at the interface of the semiconductor of said region with said relatively thick insulator portion.

16. A semiconductor memory according to claim 15, wherein said thick insulator portion is defined at the storage portion of said cell.

17. A semiconductor memory according to claim 16, wherein said gate conductor is part of a store/word conductor common to a line of said cells in said matrix and comprises a polycrystalline silicon conductor.

18. A semiconductor memory according to claim 15, wherein said store/word conductor is common to a line of cells extending in one direction in said matrix, and including a sense conductor electrically coupled to the sense portions of a line of cells extending in a perpendicular direction in said matrix.

19. A semiconductor memory according to claim 8, wherein said matrix includes lines of said cells, each said line including a sense portion common to all the cells in that line, and for each common sense portion, means for generating logic signal output levels corresponding to logic signal related charge read-out from cells in said line.

20. A semiconductor memory according to claim 19, wherein said common sense portion includes an elongated diode region, and said logic output signal generating means includes a gate electrode overlying one end of said diode region and a separate diode region in said substrate, said separate diode region being connected to the gate of an insulated gate field effect transistor output stage.

* * * * *